US010348236B2

(12) United States Patent
Lin et al.

(10) Patent No.: US 10,348,236 B2
(45) Date of Patent: Jul. 9, 2019

(54) ELECTRIC MOTOR POWER CONNECTION PROGNOSIS SYSTEMS AND METHODS

(71) Applicant: GM GLOBAL TECHNOLOGY OPERATIONS LLC, Detroit, MI (US)

(72) Inventors: Wen-Chiao Lin, Rochester Hills, MI (US); Xinyu Du, Oakland Township, MI (US); Youssef A. Ghoneim, Rochester, MI (US)

(73) Assignee: GM Global Technology Operations LLC., Detroit, MI (US)

( * ) Notice: Subject to any disclaimer, the term of this patent is extended or adjusted under 35 U.S.C. 154(b) by 164 days.

(21) Appl. No.: 15/333,216

(22) Filed: Oct. 25, 2016

(65) Prior Publication Data

US 2018/0115269 A1   Apr. 26, 2018

(51) Int. Cl.
*H02P 1/00* (2006.01)
*H02P 29/024* (2016.01)
*G01R 31/00* (2006.01)
*G01R 31/34* (2006.01)

(52) U.S. Cl.
CPC .......... *H02P 29/024* (2013.01); *G01R 31/007* (2013.01); *G01R 31/343* (2013.01)

(58) Field of Classification Search
CPC .... H02P 29/024; G01R 31/343; G01R 31/007

USPC .......................................................... 318/139
See application file for complete search history.

(56) References Cited

U.S. PATENT DOCUMENTS

| 2009/0033357 | A1* | 2/2009 | Lindsey | G01R 31/346 |
| | | | | 324/765.01 |
| 2013/0158776 | A1* | 6/2013 | Rini | G06F 17/00 |
| | | | | 701/29.4 |
| 2014/0021898 | A1* | 1/2014 | Hendrickson | H02P 29/028 |
| | | | | 318/434 |

FOREIGN PATENT DOCUMENTS

| DE | 102009019825 A1 | 11/2010 |
| DE | 102013201425 A1 | 7/2014 |
| DE | 102014114084 A1 | 4/2015 |

* cited by examiner

*Primary Examiner* — Eduardo Colon Santana
*Assistant Examiner* — Gabriel Agared
(74) *Attorney, Agent, or Firm* — Quinn IP Law

(57) ABSTRACT

A vehicle includes an electrically-driven motor configured to actuate a vehicle component and a power source configured to provide power to the motor over an electrical circuit. The vehicle also includes a controller programmed to monitor at least one signal indicative of motor output and store data indicative of a resistance in the circuit. The controller is also programmed to issue a resistance state of health signal in response to the resistance in the circuit exceeding a predetermined resistance threshold.

20 Claims, 3 Drawing Sheets

ELECTRIC MOTOR POWER CONNECTION PROGNOSIS SYSTEMS AND METHODS

TECHNICAL FIELD

The present disclosure relates to fault prediction and detection pertaining to an electrical circuit.

INTRODUCTION

Power connectors provide a physical connection between two electrical devices such as an electrical conduit and an electrically-powered component. Various systems, such as vehicles, aircraft, marine vessels, building wiring, computers, electronics, robots, etc., often include many wires, connectors, terminals, electrical harnesses that provide a power path for various systems, sub-systems, controllers, sensors, actuators, etc. For example, the electrical systems in a vehicle may include a number of multi-terminal connectors that simultaneously connect a number of wires. Many such connectors are located in areas susceptible to moisture and factors which may accelerate corrosion of the metal connections. Such corrosion in a power circuit may lead to component degraded function and/or operational failures even though a connection may be visibly intact. In certain systems such as vehicle electric power steering systems, it may be useful to detect or even predict degraded power transfer prior to system performance being affected.

SUMMARY

A vehicle includes an electrically-driven motor configured to actuate a vehicle component and a power source configured to provide power to the motor over an electrical circuit. The vehicle also includes a controller programmed to monitor at least one signal indicative of motor output and store data indicative of a resistance in the circuit. The controller is also programmed to issue a resistance state of health signal in response to the resistance in the circuit exceeding a predetermined resistance threshold.

A method of generating an electrical circuit resistance prognosis includes providing a motor-driven component powered over an electrical circuit and collecting a data set indicative of performance of the motor-driven component. The method also includes calculating a resistance value corresponding to a predetermined location within the electrical circuit. The method further includes indexing a fault counter in response to the resistance being greater than a predetermined resistance threshold, and issuing a state of health message in response to the fault counter exceeding a fault counter threshold.

A circuit prognosis system includes a power source configured to provide power to a load and an electrically-driven motor configured to actuate a vehicle component. A circuit is provided to electrically connect the power source to the motor to transfer power. The circuit prognosis system also includes a controller programmed to monitor at least one signal indicative of motor output and store data indicative of a resistance in the circuit. The controller is also programmed to issue a resistance state of health signal in response to the resistance in the circuit exceeding a predetermined threshold.

DETAILED DESCRIPTION

Figure 1:
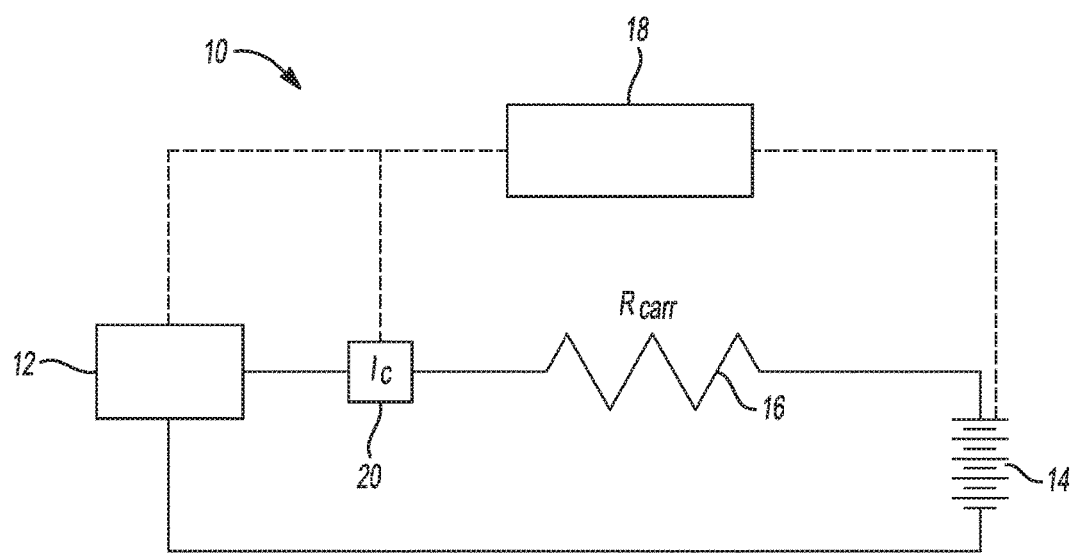
FIG. 1 is a schematic electrical circuit.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Automobiles may include numerous electronic control units (ECU's) configured to control various different vehicle subsystems, such as the engine, transmission, airbags, antilock braking, cruise control, electric power steering, audio systems, windows, doors and mirror adjustments, to name but a few. The ECU's may use a number of different control algorithms and schemes including proportional integral derivative (PID) control to regulate any of various vehicle components. Each of the subsystems is in connection with one or more power sources such as a battery or other electronic storage systems. When an ECU fails or is operational but faulty, the vehicle may exhibit poor performance or be completely disabled. The problem, however, may not originally stem from the ECU itself, but rather from an electronic fault that occurs in a power delivery circuit of a given subsystem. In other words, faults may occur in a power supply line rather than a fault with an ECU itself. In a specific example, electrical connectors may be more prone to faults related to the necessary physical discontinuity related to manufacturing needs.

The system and method described below are configured to detect power connector faults such as corrosion and ground faults using power circuit resistance measurements. While the approach and methodology are described below with respect to vehicle power delivery systems, one of ordinary skill in the art appreciates that an automotive application is merely exemplary, and that the concepts disclosed herein may also be applied to any other suitable power delivery system such as, for example, general industrial automation applications, aviation, marine vehicles, and consumer products, to name a few. The term vehicle as described herein is also to be construed broadly to include not only a passenger car, but any other vehicle including, but not limited to, motorcycles, trucks, sports utility vehicles (SUVs), recreational vehicles (RVs), marine vessels, and aircraft. The systems and methods described herein may be implemented on-board a vehicle, in off-board service tools, as well as in off-board servers in communication with the vehicle. The prognosis techniques are capable of detecting both intermittent and permanent ground faults in a power delivery system. As such, some examples may include that the methods described herein may be implemented on a service tool rather than on an ECU or gateway. Although described below with respect to a power delivery system that incorporates subsystem ECUs, one of ordinary skill in the art should appreciate that the methods disclosed herein are equally applicable to power delivery systems without local subsystem controllers.

Other previous diagnostic methods may use a CAN communication bus as a mechanism to detect circuit faults, but these are limited in that they cannot detect a resistance increase in power lines (such as resistance increase due to corrosion). CAN detection methods also cannot detect a fault within an integral ECU controller within a motor component but without a CAN transceiver (e.g., ECU connected through LIN or Ethernet)—these methods are generally limited to detecting floating grounds and ground offsets.

Referring to FIG. 1, an example schematic circuit 10 shows an electrical connection between a component 12 and a power source 14. A line resistance of the circuit is represented by resistor 16. A current sensor 20 is also disposed in the circuit to sense the passage of current along the circuit near the sensor. According to aspects of the present disclosure, the circuit 10 may represent an electrical connector disposed between the component and the power source, such as a terminal connector, a disconnectable plug and socket connector, or other connector type known in the art. Depending on the environment, the electrical connection may be exposed to environmental factors such as moisture or other corrosive accelerating factors. The proliferation of corrosion on wiring or pin connections for example, may cause an increase in resistance of the circuit. Such corrosion and/or ground faults in the circuit may be modeled as a circuit resistor having resistance $R_{corr}$. In the example schematic of FIG. 1, increased resistance of $R_{corr}$ affects the performance of the component 12.

The component 12 of FIG. 1 may be any number of vehicle component types that are affected by the occurrence of corrosion. Components relying on the operation of one or more electric motors may be particularly enhanced by aspects of the present disclosure. In one specific example, an electronic power steering (EPS) driven by an electric motor may be packaged in a wet area such that moisture may ultimately affect the electrical connections. Other examples include electrically-boosted motor-driven brake systems, DC motor power window regulators, and high-voltage traction motors.

The EPS system discussed herein may have one or more associated controllers to control and monitor operation. Controller 18, although schematically depicted as a single controller, may be implemented as one controller, or as system of controllers in cooperation to collectively manage the EPS system. Communication between multiple controllers, and communication between controllers, actuators and/or sensors may be accomplished using a direct wired link, a networked communications bus link, a wireless link, a serial peripheral interface bus or any another suitable communications link. Communications includes exchanging data signals in any suitable form, including, for example, electrical signals via a conductive medium, electromagnetic signals via air, optical signals via optical waveguides, and the like. Data signals may include signals representing inputs from sensors, signals representing actuator commands, and communications signals between controllers. In a specific example, multiple controllers communicate with one another via a serial bus (e.g., Controller Area Network (CAN)) or via discrete conductors. The controller 18 includes one or more digital computers each having a microprocessor or central processing unit (CPU), read only memory (ROM), random access memory (RAM), electrically-programmable read only memory (EPROM), a high speed clock, analog-to-digital (A/D) and digital-to-analog (D/A) circuitry, input/output circuitry and devices (I/O), as well as appropriate signal conditioning and buffering circuitry. The controller 18 may also store a number of algorithms or computer executable instructions needed to issue commands to perform actions such as prognosis according to the present disclosure.

Control module, module, controller, processor and similar terms used herein mean any suitable device or various combinations of devices, including Application Specific Integrated Circuit(s) (ASIC), electronic circuit(s), central processing unit(s) (preferably including microprocessors), and associated memory and storage (read only, programmable read only, random access, hard drive, etc.) executing one or more software or firmware programs, combinational logic circuit(s), input/output circuit(s) and devices, appropriate signal conditioning and buffer circuitry, and other suitable components to provide the described functionality. The controller 18 includes a set of control algorithms, including resident software program instructions and calibrations stored in memory and executed to provide desired functions. The algorithms may be executed during preset loop cycles. Algorithms are executed, such as by a central processing unit, and are operable to monitor inputs from sensing devices and other networked control modules, and execute control and diagnostic routines to control operation of actuators. Loop cycles may be executed at regular intervals during ongoing vehicle operation. Alternatively, algorithms may be executed in response to occurrence of one more event observed by the controller.

According to aspects of the present disclosure, the corrosion resistance $R_{corr}$ may be calculated based on signals already utilized for PID control which are generated by individual components. For example, component voltage $V_C$ may be monitored for the purpose of accurate component control. Similarly, battery terminal voltage $V_B$ is also measured to monitor track battery performance and state of health of the battery itself. Considering the simplified circuit of FIG. 1, the connector resistance $R_{corr}$ may be characterized by equation (1) below.

$$R_{corr} = \frac{V_B - V_C}{I_C} \qquad (1)$$

In at least one example, the current draw $I_C$ of the component passing through a location along the circuit may be measured directly by a current sensor. Thus, the resistance $R_{corr}$ caused by a corrosion or other fault condition may be estimated from direct measurements using equation (1). The controller 18 may then issue one or more commands based on a resistance threshold comparison. In at least one example, the estimated $R_{corr}$ may compared to a known baseline circuit resistance R. In this way excessive resistance in the circuit, for example as caused by a corrosion build up, may be promptly detected to indicate a resistance fault condition.

Figure 2:
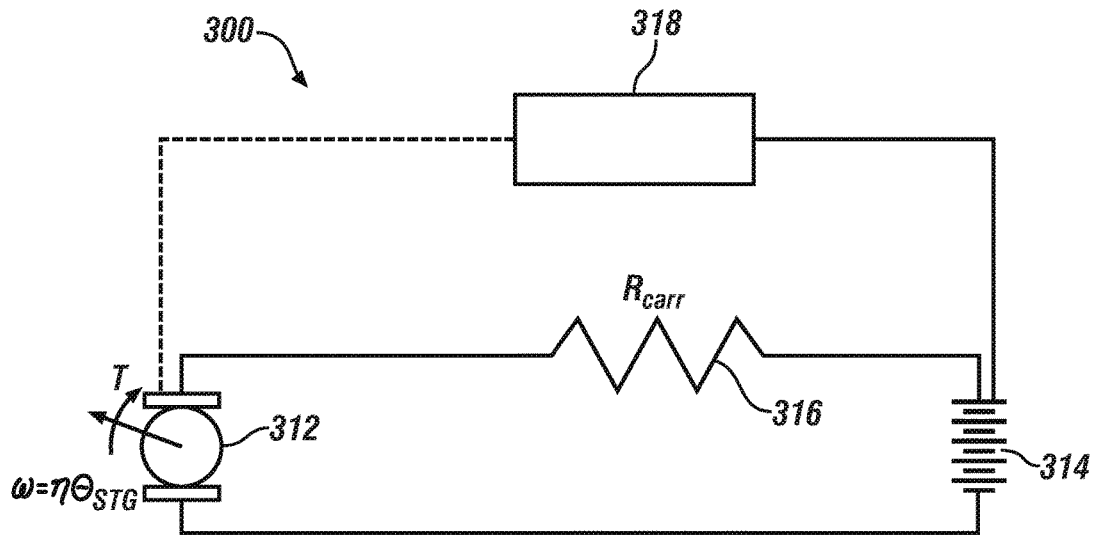
FIG. 2 is a schematic of an alternate embodiment electrical circuit.

Referring to FIG. 2, an EPS unit 312 provides motor-driven power steering for the vehicle. The EPS unit 312 receives power from power source 314 across circuit 300. Similar to previous embodiments, the circuit 300 may be considered as an electrical connector disposed between the power source 314 and the component (i.e., EPS unit 312). Resistance across the circuit 300 is modeled as resistor 316. A controller 318 is in communication with both of the EPS unit 312 and the power source 314. The EPS unit 312 includes a motor to output a torque T to drive a pinion to operate a steering rack (not shown) of the vehicle. The EPS unit 312 may also include an internal controller or ECU that stores static parameters of the motor and monitors dynamic operating conditions. For example the motor may be equipped with one or more Hall effect sensors or other measuring means to monitor steering wheel angular position $\theta_{STG}$ and/or rotational speed $\omega$ of the motor output shaft. The motor speed $\omega$ is characterized by equation (2) below, where $\dot{\theta}_{STG}$ is steering angle gradient, and n is a fixed translation factor based on a gear reduction between the motor and rate of change of the steering angle.

$$\omega = n\dot{\theta}_{STG} \qquad (2)$$

Mechanical power output of the motor may be characterized by torque times the motor speed $\omega$. In should be understood that a motor angular velocity may be used in certain alternate examples. For example, other motor-driven systems, including non-vehicular systems, may employ aspects of the present disclosure using motor angular velocity to derive mechanical power.

The motor output torque T may be measured directly by the motor ECU and output to the controller 318. In alternative examples, motor torque may not be directly monitored, but indirectly determined using other motor parameters. In one example, motor current $I_M$ may be used as a proxy for output torque applying a transfer function based on motor characteristics.

$$\text{Power}_{Mechanical} = Tn\dot{\theta}_{STG} \qquad (3)$$

In the example of FIG. 2, the circuit resistance may be determined indirectly without a dedicated current sensor. Operational parameters of the motor itself may be used to calculate the circuit resistance $R_{corr}$. In the case of no additional sensor to measure $I_C$ directly, an equivalent value may be derived from the measured parameters. Generally, power delivered to the motor across the circuit (i.e., $V_C I_C$) is equal to the overall power output by the motor (i.e., $V_M I_M$), less ECU power usage as shown in equation (4) below. $V_M$ is the motor voltage after control (e.g., pulse width modulation (PWM)) is applied to the component voltage, $V_C$. This relationship may be used to deduce circuit current $I_C$.

$$\text{Power} = V_C I_C = V_M I_M + \text{ECU usage} \qquad (4)$$

The overall power output by the motor, $V_M I_M$, includes each of the mechanical power output, power loss from motor internal resistance, and noise. Yet in many instances, both of the noise and ECU power usage may be negligible where motor current $I_M$ is sufficiently large. Equation (5) below includes terms where measured parameters are used to deduce motor power.

$$V_M I_M = I_M^2 R + Tn\dot{\theta}_{STG} + \text{noise} \qquad (5)$$

The current passing through the motor $I_M$ may be measured by the ECU, and n and R are fixed characteristic motor parameters that may be stored in a memory of the ECU. As discussed above, each of T, and $\dot{\theta}_{STG}$ may be output by the motor ECU. If each of the noise and ECU usage are neglected, $I_M^2 R + Tn\dot{\theta}_{STG}$ may be substituted for $V_C I_C$ to estimate corrosion resistance without a direct current measurement in the circuit. The estimated corrosion resistance $\hat{R}_{corr}$ follows a similar trend of resistance calculated using $I_C$ directly measured by a sensor as discussed in previous embodiments.

$$\hat{R}_{corr} = \frac{V_B - V_C}{I_C} * \frac{V_C}{V_C} = \frac{(V_B - V_C)V_C}{I_M^2 R + Tn\dot{\theta}_{STG}} \qquad (6)$$

Thus $\hat{R}_{corr}$ may be calculated by controller 318 and compared against any of a number of predetermined thresholds. Discussed in more detail below, multiple thresholds may be stored where each corresponds to a different resistance fault condition.

The above-described estimation techniques have been presented in reference to an EPS system, but may similarly apply to any system driven by an electric motor. For example, circuits involving motor-driven electric brake booster systems, windshield wiper motors, power window motors, and vehicle traction motors may all benefit from the detection resistance increases due to corrosion. Additionally, certain non-vehicular applications may similarly benefit from the disclosed systems and methods. For example, manufacturing system having electric motors, refrigerator compressor motors, and motor-driven washing machines and dryers, are all susceptible to corrosion in the power delivery connection and can benefit from the prognosis technique disclosed herein. Each of the alternative applications may carry unique power output terms based on the particular motor in use, power source, and duty cycle of the electrical system.

Figure 3:
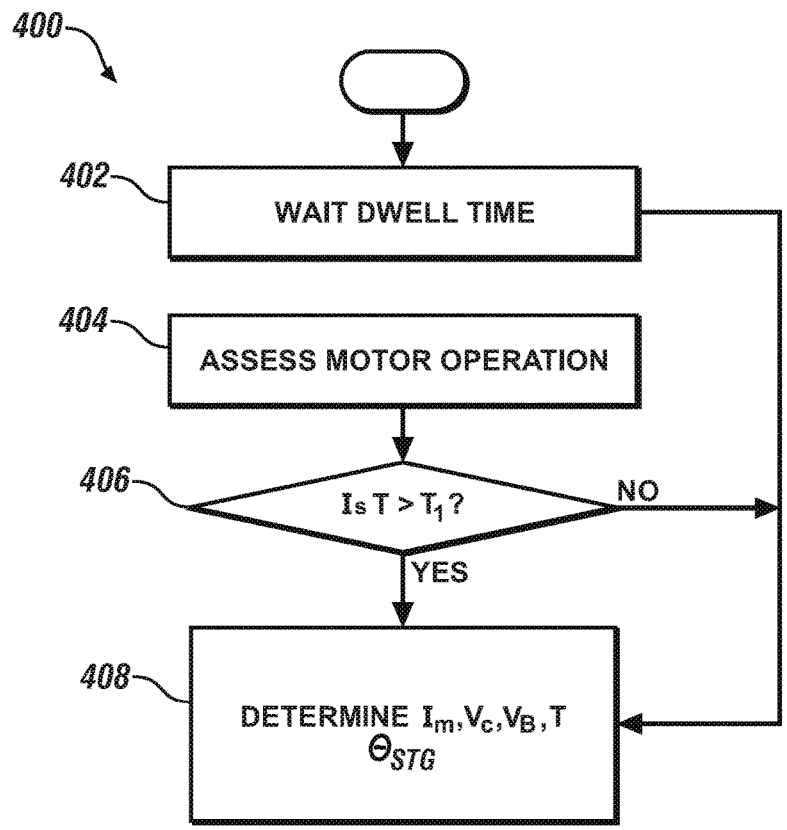
FIG. 3 is a flowchart of a data collection algorithm.

Referring to FIG. 3, method 400 depicts an algorithm for collecting data used to estimate $\hat{R}_{corr}$ for a motor-driven EPS system. The algorithm includes determining when to collect the necessary input data to estimate circuit resistance in order to detect resistance faults. Once the process is initiated, a controller may be programmed to pause during a predetermined dwell time before determining whether the EPS system is a suitable state to begin recording data. At step 402, the controller waits for a predetermined dwell time t1. In one example the dwell may be about 200 ms.

At step 404 the algorithm includes assessing the state of the motor to determine whether the motor is operating. For example, a controller may receive a signal indicative of EPS motor output torque T. If at step 406 the motor output torque T is greater than a predetermined threshold $T_1$, the torque is an indication that the EPS motor is actively outputting torque to steer the vehicle. In alternative embodiments, if motor output torque is not measured directly, alternative parameters may be used instead of output torque. In one alternate example, motor current $I_M$ may be used as a proxy for torque where the two values may be related by a suitable transfer function. If $I_M$ is greater than a predetermined current threshold, data collection may be initiated. In a second alternate example, a steering wheel angle $\theta_{STG}$ greater than a predetermined steering angle threshold while vehicle speed is nonzero may indicate imminent operation of the EPS motor triggering the data collection procedure.

If at step 406 the output torque is less than the predetermined threshold $T_1$, the algorithm may enter a loop to wait for an additional dwell time and continue to poll and re-assess motor output torque. In this way, the algorithm causes a controller to continually monitor for requisite conditions to measure EPS motor output.

At step 408 the algorithm includes acquiring signals for each of EPS motor current $I_M$, EPS monitored voltage $V_C$, power supply voltage $V_B$, motor output torque T, and steering wheel angle gradient $\dot{\theta}_{STG}$. It should be appreciated that certain of the signals may be received from one or more sensors on the vehicle. Others of the signals may be received as PID control parameters from one or more component ECU's as discussed above. Additionally, in the case where a current sensor is provided to measure circuit current $I_C$ directly, the measured current may be provided as a PID to the controller as opposed to an indirect calculation using motor output torque T, steering wheel angle gradient $\dot{\theta}_{STG}$, motor current $I_M$, EPS monitored voltage $V_C$, power supply voltage $V_B$, and fixed parameters R and n.

Figure 4:
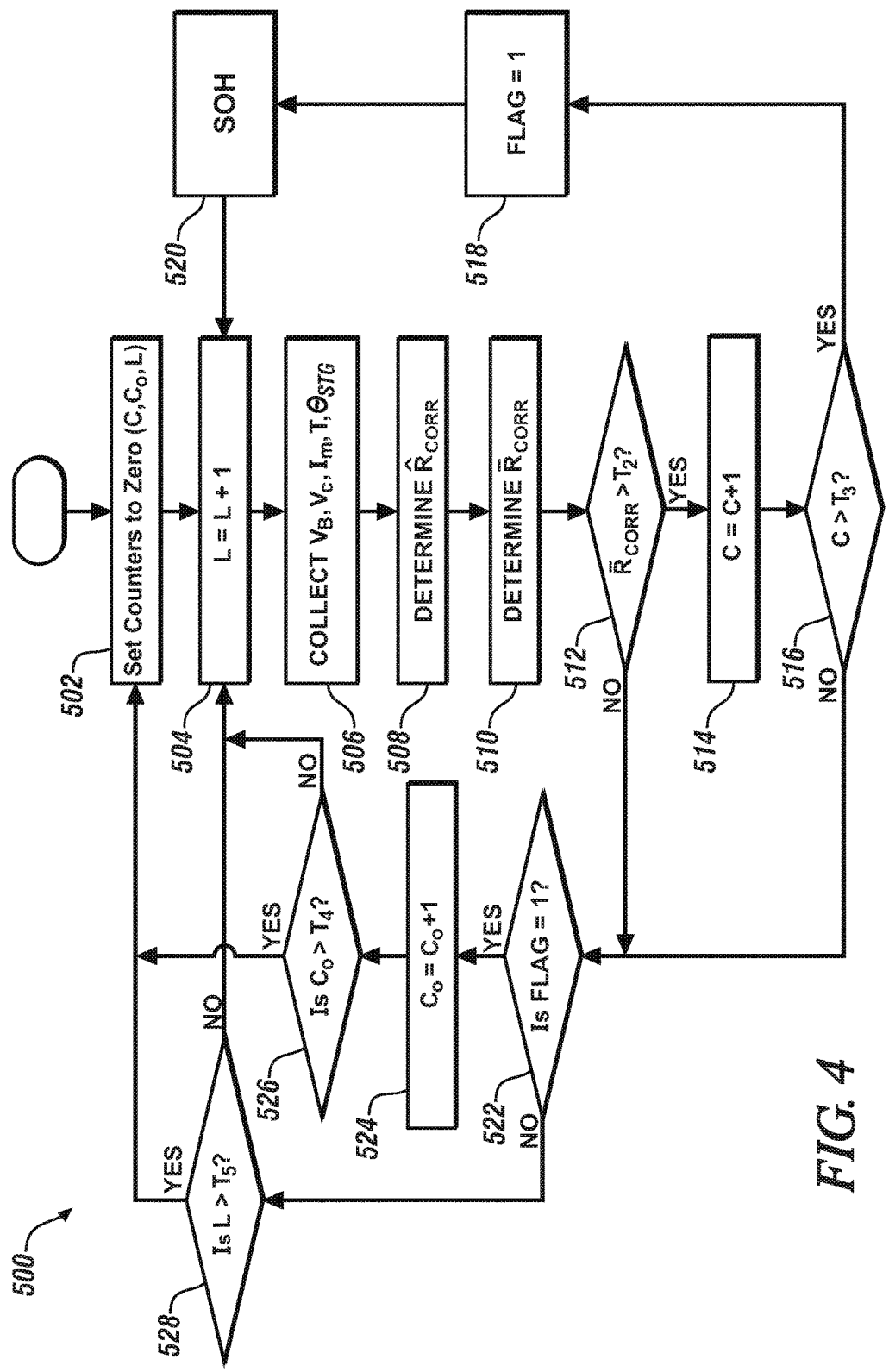
FIG. 4 is a flowchart of a fault prediction algorithm.

Referring to FIG. 4, method 500 depicts an algorithm for fault prediction related to connector resistance increase due to corrosion for example. At step 502 the controller may initialize the procedure by setting each of a plurality of counters (e.g., C, $C_0$, L), as well as a fault flag, to zero. Each of the counters and fault flag is explained in more detail below.

Generally, the counter L relates to the number of loops through which the fault prediction algorithm has passed. For extended periods of stable low resistance, L may be reset to zero to avoid counter overflow. At step 504 the L counter is incremented to one count greater than the previously-stored L value. In some examples, the L counter is effectively used as a timer. That is, if each loop substantially corresponds to a known duration of time (e.g., each loop takes about 200 ms) the loop count may be analogous to a time count. Similarly, predetermined loop count thresholds may be analogous to time thresholds in some situations.

At step 506 the algorithm includes collecting data indicative of circuit parameters, for example such as those parameters discussed in reference to method 400. More specifically a set of data containing at least $V_B$, $V_C$, $I_M$, T, and $\dot{\theta}_{STG}$ may be received at a controller. If multiple sets of data are available since the last acquisition, the controller may receive N number of data sets representing circuit behavior over a duration of time.

At step 508 the algorithm includes computing for each data set the estimated corrosion resistance $\hat{R}_{corr}$, for example as discussed in previous embodiments of the present disclosure. At step 510, the controller may compute an average corrosion resistance value $\overline{R}_{corr}$ for all N sets of data received at the controller. It should be appreciated that any portion of these calculations may be performed by an onboard processor, an off-board processor (e.g., an external data server or service tool), or any combination thereof.

At step 512 the algorithm includes comparing the average corrosion resistance value $\overline{R}_{corr}$ to a predetermined resistance threshold $T_2$. According to an example, the resistance threshold $T_2$ may be based on a characteristic reference resistance measured within the circuit at a previous time. For example the threshold may be set to a predetermined amount greater than a baseline resistance value. In another example, a rolling average may be applied to account for some degree of gradual adjustment in resistance, but trigger a fault in response to an abrupt change.

If at step 512 $\overline{R}_{corr}$ exceeds the predetermined resistance threshold (i.e., $\overline{R}_{corr} > T_2$), the algorithm includes incrementing at step 514 the C counter to one count greater than the previously-stored C value. Generally, the C counter relates to the number of times that a high resistance value has been detected. As method 500 is looped, and fault condition counts are accumulated, a certain threshold number of fault counts may correspond to a more severe resistance fault condition.

If at step 516 the number of times high resistance has been detected exceeds a count threshold (i.e., $C > T_3$) the algorithm may include setting a resistance fault flag. According to an example, a controller may be programmed to store a count threshold $T_3$ of about 15 counts. In the example of method 500, FLAG is set to 1 to indicate an EPS power connector high resistance. Stated another way, by relying on a particular number of counts (i.e., loops) at a fault condition, the algorithm may cause a controller to take a response action when the resistance in the circuit exceeds the predetermined threshold for a predetermined duration of time.

In response to the resistance fault flag, the algorithm includes issuing a component connection state of health message at step 520 based on the detected resistance values within the circuit connecting the component to the power source. When the resistance is within a first fault region, the message may correspond to a properly functioning component connection, but the fault is indicative of degraded performance. Additional state of health messages may convey higher severity and indicate imminent failure. The state of health message may also include information about the remaining useful life of the component connection. The state of health message may also be provided to a driver via a user display in the vehicle. In further examples, the state of health message may be generated by an external processor portion of the controller and sent back to the vehicle controller and/or any combination of a user's mobile device, a user's computer, a vehicle service sever, a service tool, or other external processors. Generally, the prognosis systems and methods discussed in the present disclosure provide detection and warning prior to a loss of part function. Following step 520, the algorithm returns to step 504 to continuously poll and monitor for changes in resistance within the EPS power circuit.

While a single state of health message is discussed as preceding an imminent failure message, it is contemplated that any number of varying degree severity messages may be generated based on trends of the resistance within the EPS power circuit. For example, multiple levels of warnings may be provided prior to generating an imminent failure message, where each level may include a different severity indicator. Further, different severity warning messages may have a unique combination of one or more recipients such as a driver, service technician, vehicle fleet operator, or vehicle manufacturer for example.

At step 512, if the average corrosion resistance value $\overline{R}_{corr}$ does not exceed the predetermined resistance threshold (i.e., $\overline{R}_{corr} \leq T_2$), the condition indicates that the EPS is operated with a connector resistance which is at a non-fault condition. The algorithm assesses at step 522 whether a fault flag is presently set (i.e., FLAG=1).

If the fault flag has been previously set at step 522, the algorithm includes incrementing a $C_0$ counter at step 524 to one count greater than a previously-stored $C_0$ value. Generally, the $C_0$ counter relates to the number of times a normal resistance level is detected following a previous flag condition. In this way a brief excursion in resistance that returns to a normal range may stop causing a poor state of health messages to continue to be transmitted. The algorithm also includes assessing whether the counter $C_0$ exceeds a count reset threshold $T_4$ (i.e., $C_0 > T_4$) at step 526. If a sufficient count of non-fault conditions following a previous fault flag are present at step 526, method 500 includes looping back to step 502 to reinitialize the fault prediction algorithm, and resetting each of the counters to 0. In this way, a transient or temporary fault condition may be automatically disregarded in response to a sufficient duration of stable, low resistance, conditions following detection of the fault. According to one example, the number of counts required to return to the reinitialize step following a fault flag is greater than the number of counts required to initially set the fault flag (i.e., $T_4 > T_3$).

If at step 526 counter $C_0$ does not exceed the count reset threshold $T_4$ (i.e., $C_0 \leq T_4$), the algorithm includes going back to step 504 to continuously poll and monitor for changes in resistance within the EPS power circuit.

If the fault flag has not been previously set at step 522 (also corresponding to detection of a non-fault condition at step 512), the algorithm includes assessing the L counter at step 528 to determine how many non-fault loops of method 500 have occurred. As discussed above, the L counter may be reset to zero in response to extended periods of stable resistance in order to avoid loop counter overflow. If at step 528 the L counter is greater than a non-fault count reset threshold (i.e., $L > T_5$), this means that the circuit is in an extended period of stable (i.e., low) resistance. As discussed above detection of high resistance may trigger flags according to steps 512 through 518. Following a period of low resistance, the algorithm includes returning to the initialization at step 502 to reset all of the stored counters.

If at step 528 the L counter is not greater than a non-fault count reset threshold (i.e., $L \leq T_5$), the algorithm includes keeping the existing count values and returning to step 504 to continuously poll and monitor for further changes in resistance within the EPS power circuit.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
    an electrically-driven motor configured to actuate a vehicle component;
    a power source configured to provide power to the motor over an electrical circuit; and
    a controller programmed to:
        monitor a signal indicative of motor output, wherein the signal correlates to motor torque,
        acquire data indicative of resistance in the electrical circuit only when the signal indicates the motor torque is greater than a threshold, wherein the motor torque threshold indicates that the electrically-driven motor is actively outputting torque to actuate the vehicle component,
        store the acquired data indicative of resistance in the electrical circuit, and
        issue a resistance state of health signal in response to the resistance in the electrical circuit exceeding a predetermined resistance threshold.

2. The vehicle of claim 1 wherein the resistance state of health signal is indicative of a remaining life of a connection within the electrical circuit.

3. The vehicle of claim 1 wherein the controller is programmed to transmit the state of health signal to an off-board processor when the resistance in the electrical circuit exceeds the resistance predetermined threshold for a first predetermined duration of time.

4. The vehicle of claim 1 further comprising a current sensor within the electrical circuit to sense a current provided to the motor from the power source.

5. The vehicle of claim 1 wherein the controller is programmed to reset the resistance fault signal in response to resistance in the electrical circuit being less than the predetermined threshold for a second predetermined duration of time.

6. The vehicle of claim 1 wherein the data indicative of a resistance in the electrical circuit includes at least one of a motor current, a motor output torque, a motor voltage, a power supply voltage, a component voltage monitored by the controller, and a motor angular velocity.

7. The vehicle of claim 1 wherein the electrical circuit is a portion of an electrical connector, and the resistance in the circuit is estimated at a location within the connector.

8. A method of generating a circuit resistance prognosis comprising:
    providing a motor-driven component powered over an electrical circuit;
    pausing during a predetermined dwell time, and then:
    monitoring a signal of the electrical circuit indicating motor output, wherein the signal correlates to motor torque;
    collecting a data set indicative of performance of the motor-driven component only when the signal indicates the motor torque is greater than a threshold, wherein the motor torque threshold indicates that the motor is actively outputting torque to actuate the component;
    generating a resistance value based upon the collected data set corresponding to a predetermined location within the electrical circuit;
    indexing a fault counter in response to the resistance value being greater than a predetermined resistance threshold; and issuing a state of health message in response to the fault counter exceeding a fault counter threshold.

9. The method of claim 8 wherein the predetermined location within the electrical circuit is within an electrical connector disposed between the motor-driven component and a power source.

10. The method of claim 8 wherein the resistance value corresponding to the predetermined location is based on at least one of a motor current, a motor output torque, a motor voltage, a power supply voltage, a component voltage monitored by the controller, and a motor angular velocity.

11. The method of claim 8 further comprising resetting the fault counter in response to the resistance value being less than the predetermined resistance threshold for a predetermined number of loop counts.

12. The method of claim 8 further comprising transmitting the resistance value to an off-board processor, wherein the off-board processor generates the state of health message.

13. The method of claim 8 wherein the motor-driven component is part of an electric power steering system.

14. The method of claim 8 wherein the state of health message is indicative of a remaining life of a connection within the electrical circuit.

15. A circuit prognosis system comprising:
a power source configured to provide power to a load;
an electrically-driven motor configured to actuate a vehicle component;
a circuit electrically connecting the power source to the motor to transfer power; and
a controller programmed to:
monitor a signal indicative of motor output, wherein the signal correlates to motor torque,
after a dwell time, acquire data indicative of resistance in the electrical circuit only when the signal indicates the motor torque is greater than a threshold, wherein the motor torque threshold indicates that the electrically-driven motor actively outputting torque to actuate the vehicle component,
store the data indicative of resistance in the electrical circuit, and
issue a resistance state of health signal in response to the resistance in the electrical circuit exceeding a predetermined threshold.

16. The circuit prognosis system of claim 15 further comprising a current sensor disposed within the circuit to output a signal indicative of current flow to the motor.

17. The circuit prognosis system of claim 15 wherein the electrically-driven motor is part of an electric power steering system.

18. The circuit prognosis system of claim 15 wherein the resistance state of health signal is indicative of a resistance fault of an electrical connection within the electrical circuit.

19. The circuit prognosis system of claim 15 wherein the data indicative of resistance is based on a data set including at least one of a motor current, a motor output torque, a motor voltage, a power supply voltage, a component voltage monitored by the controller, and a steering wheel angle gradient.

20. The circuit prognosis system of claim 15 wherein the controller is further programmed to transmit the data indicative of resistance to an off-board processor, and receive the resistance state of health signal from the off-board processor.

* * * * *